(12) United States Patent
Liang

(10) Patent No.: US 7,642,135 B2
(45) Date of Patent: Jan. 5, 2010

(54) THERMAL MECHANICAL FLIP CHIP DIE BONDING

(75) Inventor: Steve Xin Liang, San Diego, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 37 days.

(21) Appl. No.: 11/957,730

(22) Filed: Dec. 17, 2007

(65) Prior Publication Data

US 2009/0155955 A1      Jun. 18, 2009

(51) Int. Cl.
*H01L 21/00* (2006.01)
(52) U.S. Cl. ............... 438/113; 438/615; 257/E21.48; 257/E21.481
(58) Field of Classification Search ............... 438/113, 438/615, 120; 257/E21.48, E21.481, E21.484, 257/E21.599, E21.705
See application file for complete search history.

(56) References Cited

U.S. PATENT DOCUMENTS

| 7,087,458 | B2 | 8/2006 | Wang et al. | |
|---|---|---|---|---|
| 7,115,446 | B2 | 10/2006 | Koo et al. | |
| 7,279,359 | B2 | 10/2007 | Chen et al. | |
| 7,307,337 | B2 | 12/2007 | Ohuchi et al. | |
| 2006/0071340 | A1* | 4/2006 | Zhong et al. | 257/762 |
| 2006/0152328 | A1* | 7/2006 | Robert | 337/333 |
| 2006/0267176 | A1* | 11/2006 | Offrein et al. | 257/691 |

* cited by examiner

*Primary Examiner*—Caridad M Everhart
(74) *Attorney, Agent, or Firm*—Lando & Anastasi, LLP

(57) ABSTRACT

A thermal mechanical process for bonding a flip chip die to a substrate. The flip chip die includes a plurality of copper pillar bumps, each copper pillar bump of the plurality of copper pillar bumps having a copper portion attached to the die and a bonding cap attached to the copper portion. The process includes positioning the die on the substrate such that the bonding cap of each copper pillar bump of the plurality of copper pillar bumps contacts a corresponding respective one of a plurality of bonding pads on the substrate, and thermosonically bonding the die to the substrate.

18 Claims, 4 Drawing Sheets

THERMAL MECHANICAL FLIP CHIP DIE BONDING

BACKGROUND

1. Field of Invention

The present invention relates generally to semiconductor devices and methods for fabricating the same. More particularly, at least one embodiment is directed to a flip chip semiconductor package and die bonding process.

2. Discussion of Related Art

One semiconductor packaging technique that is widely used in the radio frequency (RF) component industry is referred to as "flip chip" packaging. Flip chip describes the method of electrically connecting the die or "chip" to the package carrier. In contrast to standard chip and wire packaging that uses bond wires to connect the die to the carrier, the interconnection between the die and the carrier in flip chip packaging is made through a conductive "bump" that is placed directly on the surface the die. The bumped die is then "flipped over" and placed face down with the bumps connecting the die to the carrier directly.

The flip chip assembly process generally includes three major steps: 1) bumping of the dies; 2) "face-down" attachment of the bumped dies to the substrate or board; and 3) under-filling, which is the process of filling the open spaces between the die and the substrate or board with a non-conductive but mechanically protective material. There are several types of bumps and bumping processes that are used for flip chip devices. For example, solder bumping includes placing an underbump metallization over the bond pad (e.g., by plating, sputtering or similar techniques), and then depositing solder over the underbump metallization. Another type of flip-chip bumping is known as "plated bumping." The bond pad is covered with a nickel layer to the desired plating thickness, forming the foundation of the bump. An immersion gold layer is then added over the nickel bump for protection. Adhesive bumping is another flip-chip bumping process that stencils electrically conductive adhesive over an underbump metallization placed over the bond pad. The stenciled adhesive serves as the bump after it has been cured.

Gold bumping is a favored bumping process, as the gold bonds provide superior bond strength because of the monolithic structure of the gold material. Gold bonds also generally have superior high frequency performance and low resistance when compared to solder or other conductive materials. Gold bumps may be formed on the flip chip die by depositing a layer of gold in the desired bump locations, or gold-plating a pad formed of another material (e.g., nickel). Flip chips with gold bumps are attached to a substrate with gold bond pads using an ultrasonic gold-to-gold interconnect (GGI) process.

GGI is a thermosonic process by which gold bumps and gold bond pads are joined together by heat and ultrasonic power under a pressure head, using a machine called a GGI bonder. The thermosonic process connection is made by solid-phase bonding between the two gold layers. Diffusion of gold (micro-welding) under load, and ultrasonic power, creates the gold-to-gold connection as a bond layer that is void-free and monolithic. The ultrasonic GGI process has a mounting accuracy of about ±10 µm and can reliably bond die with a thickness as thin as 100 µm. A disadvantage of GGI processes however, is the use of gold, an expensive material, for both the bumps and the pads.

SUMMARY OF INVENTION

Gold-to-gold thermosonic flip chip assembly is a lead-free, low-stress approach, with heating generally below 150° C. and load forces less than 100 g per bump. These features, in combination with the good bond strength and electrical performance provided by gold bumps, make the gold-to-gold interconnect (GGI) process attractive for many applications. However, as discussed above, gold is an expensive material and therefore, gold bumping (and providing substrates with gold bond pads) is far more expensive than solder bumping.

Copper pillar bumping is a process and structure that may be favored over solder bumping, for reasons discussed below, and also over gold bumping because it is less expensive. However, conventional copper-tin flip chip die bonding for flip chips having copper pillar bumps requires an assembly process that conventionally includes separate steps for die/flux placement, solder reflowing and flux cleaning. In a conventional copper-tin flip chip die bonding process, the wafer is first dipped in flux and placed on the substrate, after which a separate reflow process forms the connection between the wafer and the substrate. Finally, the wafer and substrate are cleaned in a further step to remove the flux. This assembly process substantially increases the cost of manufacture of components, eroding most, if not all, of the savings achieved by using copper-tin bonds instead of a GGI process. Thus, conventional die bonding processes, whether a GGI process or copper-tin bonding, suffer from several disadvantages. Therefore, at least some aspects and embodiments are directed to a one-step, flux-free die bonding process that incorporates copper pillar bumping, and provides the benefits of the lower cost and good performance of copper pillar bumps together with a simpler assembly process.

One embodiment is directed to a method of bonding a die comprising at least one copper pillar bump to a substrate having a corresponding at least one pad, the copper pillar bump including a copper portion and a bonding cap. In this embodiment, the method includes positioning the die on the substrate such that the bonding cap of the at least one copper pillar bump contacts the at least one pad, and applying thermal and mechanical energy to the at least one copper pillar bump to bond the die to the substrate. In one example, positioning the die and applying the thermal and mechanical energy may be performed substantially simultaneously. In another example, the bonding cap may be a solder cap and applying the thermal and mechanical energy includes applying sufficient thermal and mechanical energy to at least partially melt the solder cap to bond the die to the substrate. In a further example, applying thermal and mechanical energy includes applying ultrasonic energy to the at least one copper pillar bump while applying mechanical pressure to press the die to the substrate. The method may also comprise preheating the die and/or the substrate prior to applying the ultrasonic energy and mechanical pressure.

According to another embodiment, a method of manufacture of a semiconductor device comprises forming a plurality of copper pillar bumps on a wafer, each copper pillar bump of the plurality of copper pillar bumps comprising a copper portion and a bonding cap, singulating the wafer into a plurality of dies, each die comprising at least one copper pillar bump of the plurality of copper pillar bumps, positioning the plurality of dies on a substrate, and thermosonically bonding the plurality of dies to the substrate. In one example, the substrate may comprise a plurality of conductive pads (e.g., comprising a metal such as copper, gold, nickel, etc.), and positioning the plurality of dies on the substrate includes positioning the plurality of dies such that the bonding cap of each copper pillar bump of the plurality pillar bumps contacts a respective one of the plurality of conductive pads. In another example, the bonding cap comprises a solder cap and thermosonically bonding the plurality of dies to the substrate includes applying thermal energy to the plurality of copper pillar bumps to at least partially melt the solder cap. In another example, thermosonically bonding the plurality of dies to the substrate includes applying ultrasonic energy to the plurality of copper pillar bumps and applying mechanical pressure to press the plurality of dies to the substrate. In a further example, thermosonically bonding the plurality of dies to the substrate includes preheating the plurality of dies and subsequently applying ultrasonic energy and mechanical pressure to at bond the plurality of dies to the substrate. The method may further comprise at least partially covering the plurality of dies with an overmolding compound.

Another embodiment is directed to a method of bonding a flip chip die to a substrate, the flip chip die comprising a plurality of copper pillar bumps, each copper pillar bump of the plurality of copper pillar bumps comprising a copper portion attached to the die and a bonding cap attached to the copper portion. In this embodiment, the method includes positioning the die on the substrate such that the bonding cap of each copper pillar bump of the plurality of copper pillar bumps contacts a corresponding respective one of a plurality of bonding pads on the substrate, and thermosonically bonding the die to the substrate. In one example, the bonding cap comprises a solder cap, and thermosonically bonding the die to the substrate includes applying thermal and mechanical energy to the die to at least partially melt the solder cap to form bonds between the plurality of copper pillar bumps and the corresponding plurality of bonding pads on the substrate. Applying the thermal and mechanical energy may include, for example, applying ultrasonic energy and applying mechanical pressure to press the die to the substrate. The thermosonic bonding can also optionally include preheating the die and/or the substrate. These acts may be preformed individually or substantially simultaneously.

Still other aspects, embodiments, and advantages of these exemplary aspects and embodiments, are discussed in detail below. Moreover, it is to be understood that both the foregoing information and the following detailed description are merely illustrative examples of various aspects and embodiments, and are intended to provide an overview or framework for understanding the nature and character of the claimed aspects and embodiments. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF THE DRAWINGS

Various aspects of at least one embodiment are discussed below with reference to the accompanying figures. In the figures, which are not intended to be drawn to scale, each identical or nearly identical component that is illustrated in various figures is represented by a like numeral. For purposes of clarity, not every component may be labeled in every drawing. The figures are provided for the purposes of illustration and explanation and are not intended as a definition of the limits of the invention. In the figures.

DETAILED DESCRIPTION

At least some aspects and embodiments are directed to flip chip die bonding techniques and processes, and devices made according to the same. As discussed above, conventional flip chip to substrate interconnection copper-tin bonding methods require multi-step assembly processes, which are undesirable. Although gold-to-gold interconnect (GGI) processes may be simpler and cleaner, gold is expensive and it may therefore, often be undesirable to use gold-bumped dies. According to at least some aspects of the invention, a flip chip bonding method may include a thermosonic die bonding process in which thermal and ultrasonic energy may be applied, under pressure, to achieve a bond between a copper pillar bump on a wafer and a conductive pad of a substrate. As discussed above, thermosonic bonding is used in GGI bonders to form pure gold bonds between gold-bumped dies and the gold pads of a substrate. However, these gold bolds are homogenous, and gold is known to be a soft, malleable metal, unlike many solder alloys, particularly lead-free solder alloys, which are fairly brittle. Surprisingly, it has been found that a thermosonic process may be successfully applied to copper pillar bumps, despite the fact that the copper pillar bumps comprise heterogeneous materials and even where lead-free solder is used. Various aspects and embodiments of thermosonic die bonding methods are discussed below with reference to the accompanying figures.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items.

Figure 1:
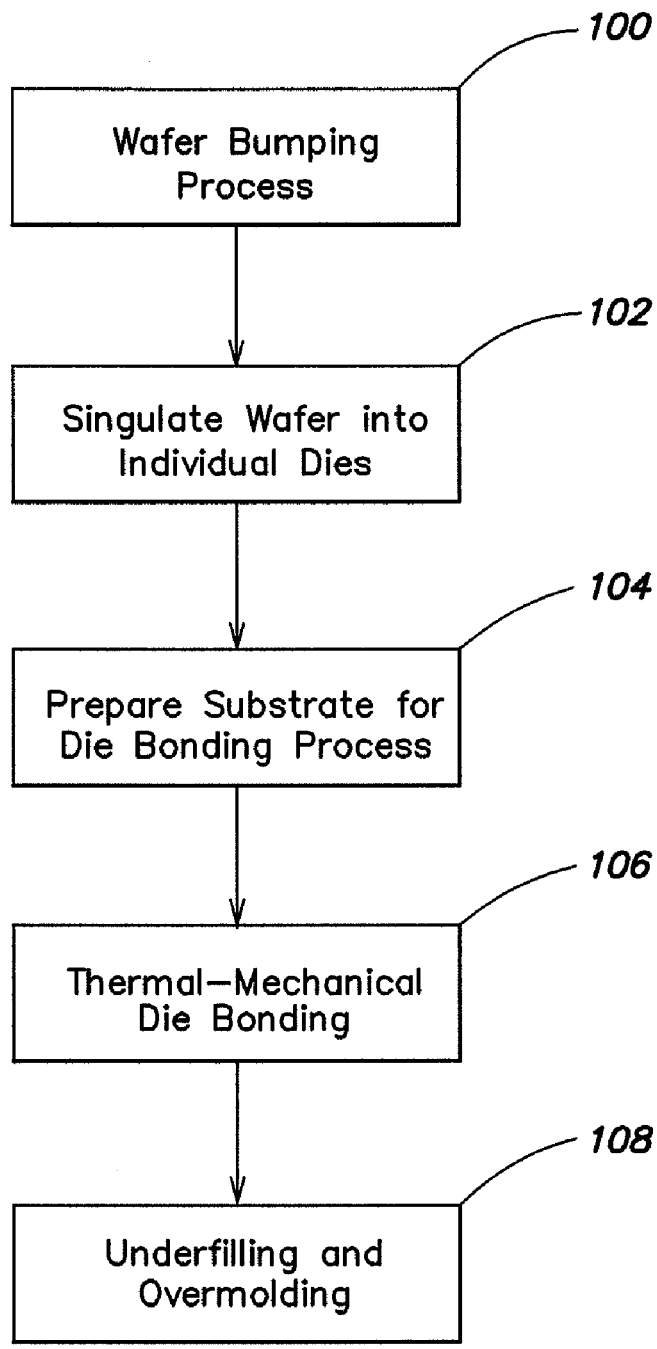
FIG. 1 is a flow diagram illustrating one example of a process according to aspects of the invention.

A flow diagram of one example of a process and method of manufacturing semiconductor devices is illustrated in FIG. 1. Aspects and embodiments of the process are discussed below with continuing reference to FIG. 1.

Figure 2:
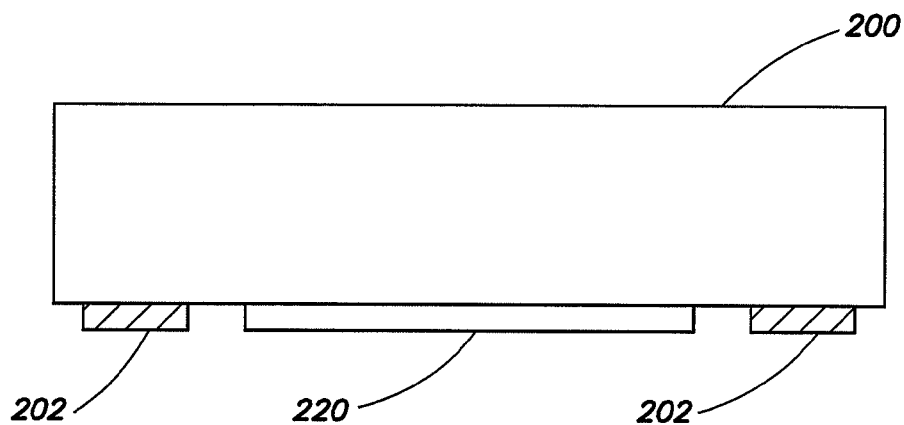
FIG. 2 is a cross-sectional diagram of one example of a wafer.

According to one embodiment, a process of producing semiconductor devices may include attaching "bumps" to a semiconductor wafer in a wafer bumping process, as indicated by step 100 in FIG. 1. Referring to FIG. 2, there is illustrated one example of a semiconductor wafer 200. The wafer may comprise a die 220 and pads 202 to which the bumps will be attached to allow the wafer 100 to be mounted flip chip to a substrate, as discussed further below. It is to be appreciated that in at least one embodiment, the entire processes of bumping may be done at the wafer level, and therefore, the wafer 200 may comprise a plurality of dies 220. Bumped wafers may then be singulated (step 102 in FIG. 1) into individual flip-chips that get mounted on a board or substrate, as discussed further below. Alternatively, the process of bumping may be done at the chip level, such as where a wafer comprising a plurality of dies (or a plurality of modules, each module comprising two or more dies) has already been singulated into individual chips, and each chip may be individually bumped. Therefore, it is to be appreciated that the term "wafer" as used in connection with wafer 200 is intended to include all and any of a semiconductor wafer having a plurality of dies or modules disposed thereon, an individual die, or an individual module that is comprised of at least two dies. Furthermore, the term "die bonding" (and similar phrases) as used herein is intended to refer to bonding of the wafer (that comprises at least one die) to the substrate.

Figure 3:
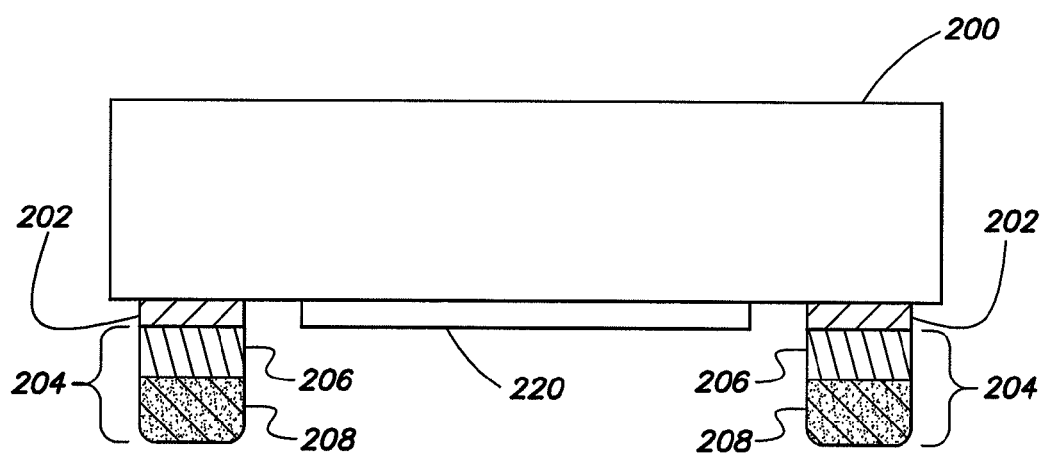
FIG. 3 is a cross-sectional diagram of the wafer of FIG. 2, with copper pillar bumps attached thereto.

In one embodiment, bumping the wafer (step 100) may include performing a copper pillar bumping process. Referring to FIG. 3, there is illustrated one example of the wafer 200 with copper pillar bumps 204 attached to the pads 202. The copper pillar bumps 204 comprise two parts: a copper pillar 206 and a bonding cap 208. In one example, the bonding cap is a solder cap, and the pillar 206 is cylindrical in shape. However, it is to be appreciated that the invention is not so limited, and the bonding cap 208 may comprise materials other than solder, such as, for example, gold, and the copper pillar 206 may have other than a cylindrical shape. Copper pillar bumps are preferred over pure solder bumps for a variety of reasons. The copper pillar bump typically provides a better electrical connection with improved thermal characteristics due to the greater conductivity of copper as compared to solder alloys. In addition, the copper pillar bump can be narrower, due to the copper cylinder, than a spherical solder bump of the same height. Thus, copper pillar bumps may facilitate a finer connection grid. Accordingly, methods according to aspects of the invention for bonding devices with copper pillar bumps that do not require the multi-step assembly and clean-up procedures associated with conventional copper-tin bonding processes may be advantageous.

Still referring to FIG. 3, in one example, the copper pillar 206 may be approximately 60 to 70 micrometers (μm) in height. In many applications it is desirable to provide "green" components which are lead-free, or at least use a minimal amount of lead. Therefore, in at least some examples, the bonding cap 208 may comprise a lead-free solder alloy or a metal such as gold. In this case, if the bonding cap comprises solder, the solder alloy may have a high tin content. Alternatively, the bonding cap 208 may comprise a eutectic tin-lead solder. To manufacture the copper pillar bumps 204, bumping step 100 may comprise a two stage electroplating process in which the copper pillar 206 is electroplated onto the pad 102, and the bonding cap 208 is deposited on top of the copper cylinder 206.

As discussed above, in at least one embodiment, after the copper pillar bumps 204 have been attached to the wafer 200, the wafer 200 may be singulated (step 102, FIG. 1) into individual dies 216 that may be flip chip mounted to a substrate. The wafer may be singulated such that each individual die may comprise at least one, and more typically several, copper pillar bumps.

Figure 4:
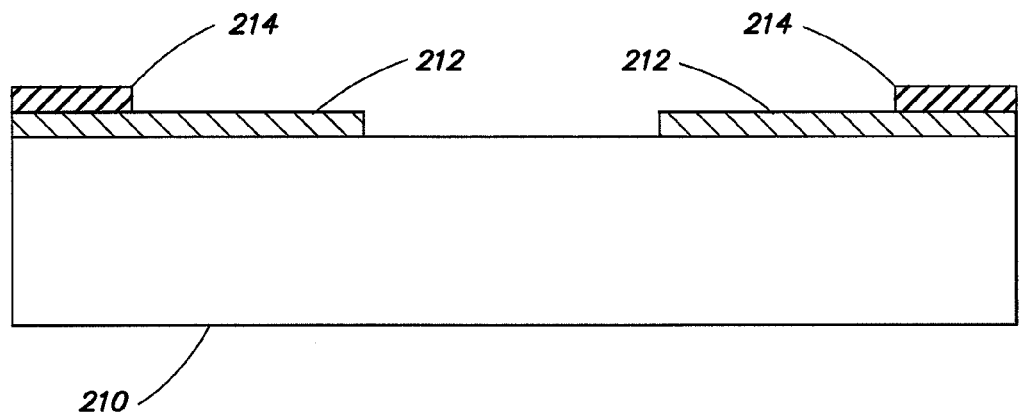
FIG. 4 is a cross-sectional diagram of one example of a plated substrate.

Referring to FIG. 4, there is illustrated a portion of one example of a substrate. The substrate 210 may comprise conductive pads 212 to which the copper pillar bumps of the wafer (or singulated dies) may be attached. In one example, the substrate 210 may be a conventional laminate substrate, such as FR4, with gold finishing, such that the pads 212 are formed of gold (or at least are gold-plated). However, the pads may alternatively comprise a conductive material or metal other than gold, such as, for example, copper, silver, palladium, or solder. Prior to bonding the dies to the pads 212, the gold pads 212 may be cleaned using a plasma cleaning process, as known to those skilled in the art. This cleaning may be part of step 104 (see FIG. 1) of preparing the substrate for bonding. The preparing step 104 may also include depositing a dielectric layer (such as a solder mask) 214. It is to be appreciated that although step 104 is illustrated in FIG. 1 as following steps 100 and 102, the invention is not so limited and step 104 may be performed at any time prior to bonding (i.e., step 106).

Figure 5:
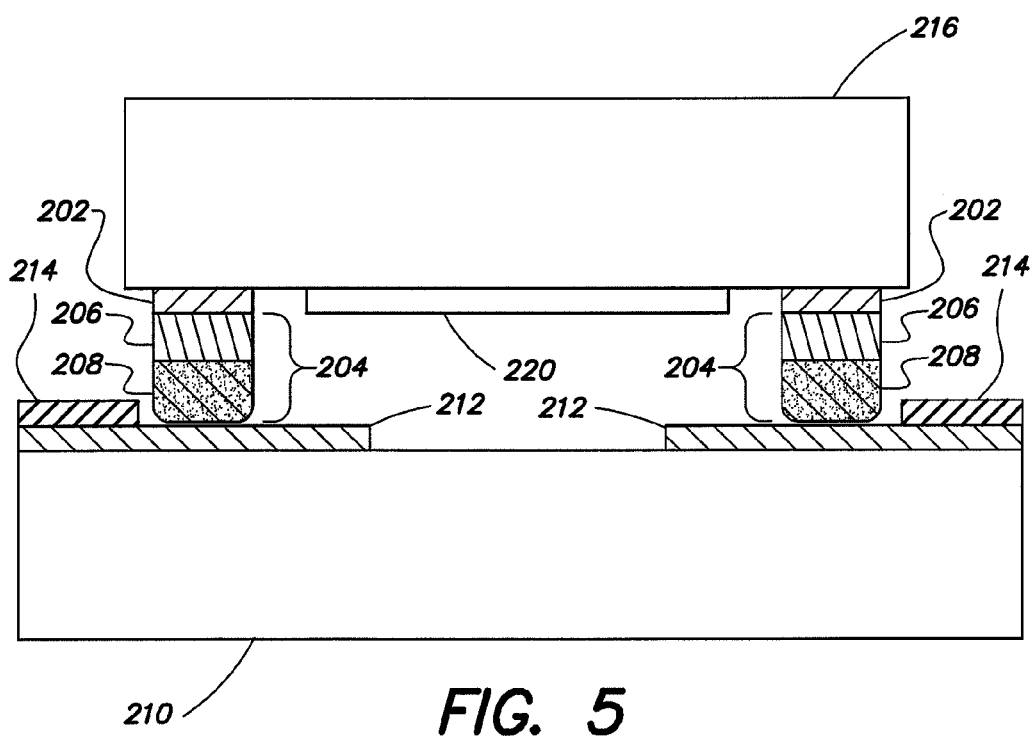
FIG. 5 is a cross-sectional diagram of a die bonded to the plated substrate of FIG. 4, according to aspects of the invention.

A next step 106 may comprise bonding one or more dies (from the singulated wafer 200) to the substrate 210. Referring to FIG. 5, there is illustrated one example of a flip chip die 216 (having the copper pillar bumps 204 discussed above) positioned ready for bonding on substrate 210. According to one embodiment, the bonding step 106 may comprise a thermal-mechanical die bonding process in which thermal and mechanical energy is used to achieve a connection between the die 216 and the substrate 210. A machine such as, or similar to, a conventional GGI bonder may be used to apply the thermal and mechanical energy. For example, the substrate 210, and die(s) 216 may be placed in a pressure head of the bonding machine (as is done during a GGI process). The machine may be controlled to provide thermal energy to melt the solder cap 208 of the copper-pillar bumps 204, while the pressure head supplies mechanical energy to press the die 216 to the substrate 210. The combination of thermal and mechanical energy may sufficiently deform the bonding cap 208 to cause the copper pillar bump to bond to the conductive pad 212 of the substrate 210 and achieve connection of the die 216 to the substrate 210. For example, if the bonding cap 208 is a solder cap, a combination of sufficient thermal energy and mechanical pressure is applied to at least partially melt the solder cap 208 to bond the copper pillar bump to the conductive pad 212 of the substrate 210.

In one embodiment, the die may be preheated, for example to soften the solder where a solder cap 208 is used. The substrate 210 may also be heated to enhance bonding. The bonding machine may then apply ultrasonic energy while the pressure head mechanically presses the die(s) to the substrate. In the example of the bonding cap 208 being a solder cap, the ultrasonic energy, in combination with the pressure supplied by the pressure head of the bonding machine may act as a localized mechanical reflow process to melt the solder cap 208 to form a permanent connection between the die 216 and the substrate 210. The thermosonic bonding process may achieve bonding of the die to the substrate in a single step, unlike conventional processes which require separate preparation, reflow and clean-up steps. In addition, thermosonic die bonding in accordance with embodiments of the invention is a flux-less process that therefore, facilitates minimizing contamination. This may be particularly advantageous for the manufacture of components such as bulk acoustic wave (BAW) or other MEMS devices that are very sensitive to contamination by flux residue.

In one example, a successful bond was achieved between a die with copper pillar bumps and a substrate with gold pads. In this example, a pure tin solder was used for the solder cap

208. Prior to bonding, the gold pads of the substrate were cleaned using a plasma cleaning process. A PSX303 plasma cleaning machine from Panasonic was used. The machine used Argon gas for the cleaning, at an operating power of 600 Watts and a gas pressure of 20 Pascals. The Argon gas was applied to the substrate pads at a flow rate of 5 milliliters per minute for 30 seconds. A pressure of about 12 Newtons was used for bonding, with an ultrasonic power of about half a Watt. A temperature of about 260 degrees Celsius was used to melt the pure tin solder, and the bonding time was about 0.3 seconds. It is to be appreciated that different temperature, pressure and/or ultrasonic energy may be needed for copper pillar bumps that have a solder alloy other than pure tin, and that the invention is not limited to the use of pure tin solder. After bonding, the die and substrate were subjected to a die shear test in order to test the mechanical integrity of the thermal-mechanically formed bonds between the die and the substrate. The average die shear force per copper pillar bump was about 43 grams. It was observed that the point of failure was at the tin solder.

Figure 6:
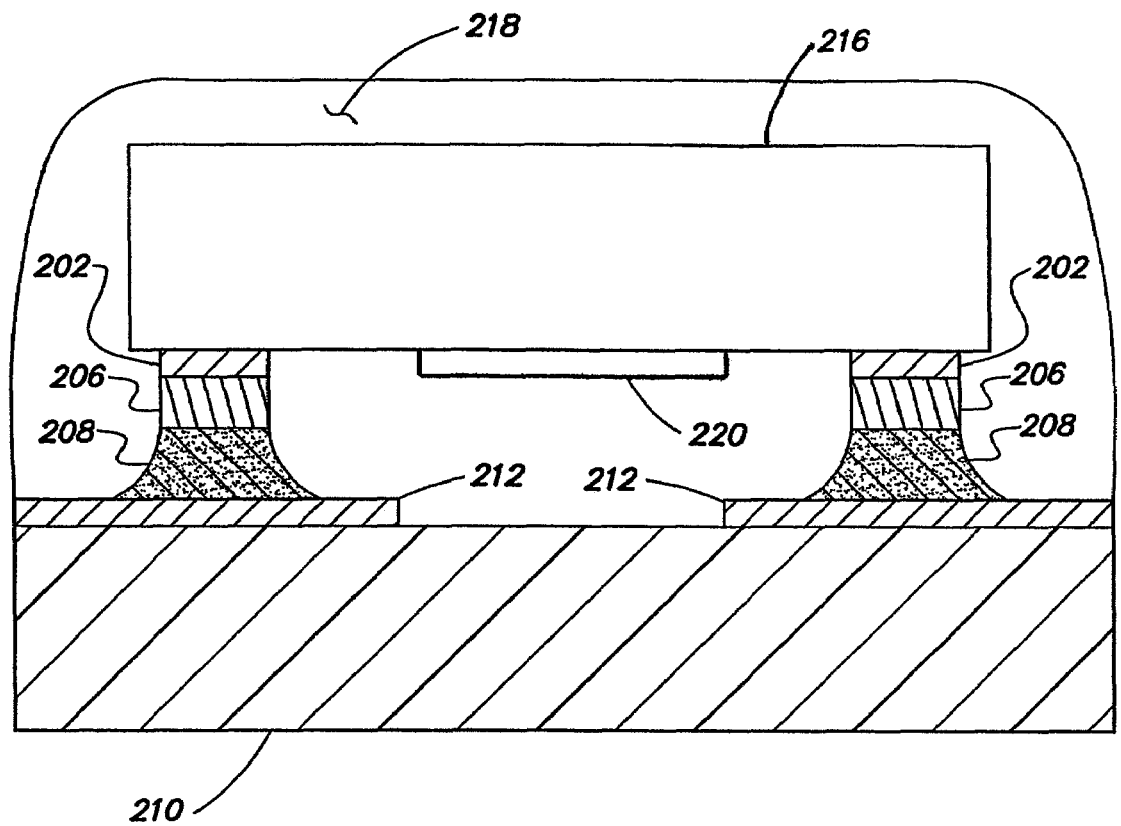
FIG. 6 is a cross-sectional diagram of the structure of FIG. 5 with overmolding and underfilling.

Referring again to FIG. 1, after the die(s) have been bonded to the substrate, the unit may be further processed to complete packaging of the components (step 108). This further processing may include underfilling and overmolding, as is conventionally done with flip chip devices, as well as forming connections to the die and, optionally, attaching a ball grid array (or other connection structure) to the substrate. Referring to FIG. 6, there is illustrated an example of a die 216 bonded to the substrate 210, and with an overmolding compound 218 applied over the die 216. It can also be seen that the bonding cap 208 is deformed by the bonding process (e.g., the solder, where a solder cap is used, is melted and thus changes shape) to bond to the pad 212 of the substrate 210.

As discussed above, conventional copper-tin die bonding processes require several, typically discrete, assembly steps including flux deposition, solder reflowing and flux cleanup, which add cost and inconvenience to the conventional use of copper-tin die bonding. By contrast, the thermal-mechanical die bonding process according to aspects and embodiments of the invention is a flux-free process that has a simple process flow and low assembly cost. In at least one embodiment, thermal and mechanical energy may be applied during placement of the die(s) on the substrate, facilitating a one-step die bonding process.

Having thus described several aspects of at least one embodiment, it is to be appreciated various alterations, modifications, and improvements will readily occur to those skilled in the art. For example, the charger current (and thus charger power) may be adjusted based on inputs other than maximum allowable input current and maximum allowable battery charging current. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A method of bonding a die comprising at least one copper pillar bump to a substrate having a corresponding at least one pad, the copper pillar bump including a copper portion and a bonding cap, the method comprising:
   positioning the die on the substrate such that the bonding cap of the at least one copper pillar bump contacts the at least one pad; and
   applying thermal and mechanical energy to the at least one copper pillar bump to bond the die to the substrate, including applying ultrasonic energy to the at least one copper pillar bump while applying mechanical pressure to press the die to the substrate.

2. The method as claimed in claim 1, wherein positioning the die and applying the thermal and mechanical energy are performed substantially simultaneously.

3. The method as claimed in claim 1, further comprising preheating the die prior to applying the ultrasonic energy and mechanical pressure.

4. The method as claimed in claim 1, further comprising pre-heating the substrate prior to applying the ultrasonic energy and mechanical pressure.

5. The method as claimed in claim 1, wherein the bonding cap comprises a solder cap.

6. The method as claimed in claim 5, wherein applying the thermal and mechanical energy includes applying sufficient thermal and mechanical energy to at least partially melt the solder cap to bond the die to the substrate.

7. A method of manufacture of a semiconductor device, the method comprising:
   forming a plurality of copper pillar bumps on a wafer, each copper pillar bump of the plurality of copper pillar bumps comprising a copper portion and a bonding cap;
   singulating the wafer into a plurality of dies, each die comprising at least one copper pillar bump of the plurality of copper pillar bumps;
   positioning the plurality of dies on a substrate; and
   thermosonically bonding the plurality of dies to the substrate.

8. The method as claimed in claim 7, further comprising at least partially covering the plurality of dies with an overmolding compound.

9. The method as claimed in claim 7, wherein the substrate comprises a plurality of conductive pads, and wherein positioning the plurality of dies on the substrate includes positioning the plurality of dies such that the bonding cap of each copper pillar bump of the plurality copper pillar bumps contacts a respective one of the plurality of conductive pads.

10. The method as claimed in claim 9, wherein thermosonically bonding the plurality of dies to the substrate includes applying ultrasonic energy to the plurality of copper pillar bumps and applying mechanical pressure to press the plurality of dies to the substrate.

11. The method as claimed in claim 9, wherein the bonding cap of each copper pillar bump comprises a solder cap.

12. The method as claimed in claim 11, wherein thermosonically bonding the plurality of dies to the substrate includes applying thermal energy to the plurality of copper pillar bumps to at least partially melt the solder cap.

13. The method as claimed in claim 9, wherein thermosonically bonding the plurality of dies to the substrate includes preheating the plurality of dies and subsequently applying ultrasonic energy and mechanical pressure to at bond the plurality of dies to the substrate.

14. A method of bonding a flip chip die to a substrate, the flip chip die comprising a plurality of copper pillar bumps, each copper pillar bump of the plurality of copper pillar bumps comprising a copper portion attached to the die and a bonding cap attached to the copper portion, the method comprising:
   positioning the die on the substrate such that the bonding cap of each copper pillar bump of the plurality of copper pillar bumps contacts a corresponding respective one of a plurality of bonding pads on the substrate; and
   thermosonically bonding the die to the substrate.

15. The method as claimed in claim 14, wherein applying thermal and mechanical energy includes applying ultrasonic energy and mechanical pressure.

16. The method as claimed in claim 14, wherein thermosonically bonding the die to the substrate includes preheating at least one of the die and the substrate, and subsequently applying ultrasonic energy to the plurality of copper pillar bumps while applying mechanical pressure to press the die to the substrate.

17. The method as claimed in claim 14, wherein the bonding cap comprises a solder cap.

18. The method as claimed in claim 17, wherein thermosonically bonding the die to the substrate includes applying thermal and mechanical energy to the die to at least partially melt the solder cap to form bonds between the plurality of copper pillar bumps and the corresponding plurality of bonding pads on the substrate.

* * * * *